US012733386B2

(12) United States Patent
Kim et al.

(10) Patent No.: US 12,733,386 B2
(45) Date of Patent: Sep. 8, 2026

(54) DISPLAY DEVICE

(71) Applicant: LG Display Co., Ltd., Seoul (KR)

(72) Inventors: SungHun Kim, Paju-si (KR); JooSang Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 413 days.

(21) Appl. No.: 18/455,379

(22) Filed: Aug. 24, 2023

(65) Prior Publication Data

US 2024/0222576 A1 Jul. 4, 2024

(30) Foreign Application Priority Data

Dec. 30, 2022 (KR) ........................ 10-2022-0191166

(51) Int. Cl.
*H10K 59/80* (2023.01)
*B23K 26/351* (2014.01)
*H10H 20/01* (2025.01)

(52) U.S. Cl.
CPC ....... *H10K 59/8793* (2023.02); *B23K 26/351* (2015.10); *H10H 20/0363* (2025.01)

(58) Field of Classification Search
CPC .......................... H10K 59/8793; G02B 5/3033
See application file for complete search history.

(56) References Cited

U.S. PATENT DOCUMENTS

2016/0190522 A1 6/2016 Lee et al.
2018/0133842 A1 5/2018 Jeong et al.
2019/0310511 A1* 10/2019 Yamamoto ........ G02F 1/133512

FOREIGN PATENT DOCUMENTS

CN 101852938 A * 10/2010
JP 2014026200 A * 2/2014
KR 10-2017-0102181 A 9/2017
KR 10-2018-0055979 A 5/2018
KR 10-2018-0109012 A 10/2018
KR 20180109012 A * 10/2018 ........... G02F 1/1313
KR 10-2019-0107710 A 9/2019
TW 201214360 A * 4/2012 ........... G02B 5/3033

OTHER PUBLICATIONS

Korean Intellectual Property Office, Office Action, Korean Patent Application No. 10-2022-0191166, Sep. 16, 2025, 11 pages.

* cited by examiner

*Primary Examiner* — Mariceli Santiago
(74) *Attorney, Agent, or Firm* — Fenwick & West LLP

(57) ABSTRACT

Embodiments of the present disclosure relate to a display device. The display device includes a glass substrate having a light emitting element layer and a polarization plate positioned on a front face of the glass substrate. The polarization plate includes a first protruded part having a first tip end that coincides with a first edge of the glass substrate and a second protruded part having a second tip end that coincide with a second edge of the glass substrate. During laser trimming, laser beam starts at the first tip end and ends at the second tip ends. Since the first tip end and the second tip end do not overlap, energy directly transferred by the laser beam to areas of the glass substrate that overlap a start point and an end point of the laser trimming is reduced, which in turn reduces micro cracks on the glass substrate.

14 Claims, 6 Drawing Sheets

LS

*RELATED ART*

DISPLAY DEVICE

CROSS-REFERENCE TO RELATED APPLICATION

This application claims priority from Republic of Korea Patent Application No. 10-2022-0191166, filed on Dec. 30, 2022, which is hereby incorporated by reference in its entirety.

BACKGROUND

Technical Field

Embodiments of the present disclosure relate to a display device.

Description of Related Art

Display devices are widely used in display screens of a notebook computer, a tablet computer, a smartphone, a mobile display device, a mobile information device, and the like addition to a television set or a display device of a monitor.

Display devices can be classified into a reflection-type display device and a light emitting-type display device. The reflection-type display device is a display device of a type in which information is displayed by reflecting natural light or light emitted from an external lamp of the display device on the display device. The light emitting-type display device is a type in which a light emitting element or a light source is built into the display device, and information is displayed using light generated by the built-in light emitting element light source.

SUMMARY

In a conventional display device, laser trimming is performed on a polarization plate positioned on top of a glass substrate. During laser trimming, a laser beam is directly emitted at a start point of the polarization plate and ends at an end point of the polarization plate. When the start point and end point overlap, energy of the laser beam is accumulated at a start point or end point of a glass substrate, and the laser beam directly may penetrate the polarization plate to reach the glass substrate, resulting in the glass substrate being damaged. As such, there is a problem with the reliability of the glass substrate due to accumulation of energy of the laser beam at the start point or end point of the glass substrate.

Thus, inventors of this specification have invented a display device and/or a method of manufacturing a display device that solves the above-described problem. In one embodiment, a display device includes a glass substrate including a light emitting element layer. The light emitting element layer is configured to emit light. The display device also includes a polarization plate positioned on a front face of the glass substrate such that a side of the polarization plate is spaced apart from a side of the glass substrate and the side of the polarization plate overlaps the glass substrate. The side of the polarization plate includes a first protruded part having a first tip end that coincides with an edge of the glass substrate and a second protruded part having a second tip end that coincides with the edge of the glass substrate.

In one embodiment, a display device includes a substrate including a display region in which an image is displayed. The substrate has a plurality of first corners at a first side of the substrate. The display device further includes a light emitting layer on the display region of the substrate. The light emitting layer is configured to emit light. The display device further includes a polarization plate on the substrate. The polarization plate has a plurality of first corners at a first side of the polarization plate that are aligned with the plurality of first corners at the first side of the substrate.

In one embodiment, a method for manufacturing a display device includes positioning a polarization plate on a first surface of a glass substrate such that a first side of the polarization plate is spaced apart from a first side of the glass substrate and the first side of the polarization plate overlaps the glass substrate, and such that a second side of the polarization plate extends past a second side of the glass substrate. The glass substrate has a plurality of first corners at the first side of the glass substrate. The method further includes applying a laser from a start point on the first side of the polarization plate that corresponds to a first corner from the plurality of first corners of the glass substrate to an end point on the side of the polarization plate that corresponds to another first corner from the plurality of first corners of the glass substrate without trimming the first side of the polarization plate.

Embodiments of the present disclosure provide a display device capable of minimizing or at least reducing energy that is directly delivered by a laser beam to a glass substrate in laser trimming, which in turn decreases the occurrence of micro cracks on the glass substrate.

The embodiments of the present disclosure also provide a display device enabling process optimization.

DETAILED DESCRIPTION

Figure 1:
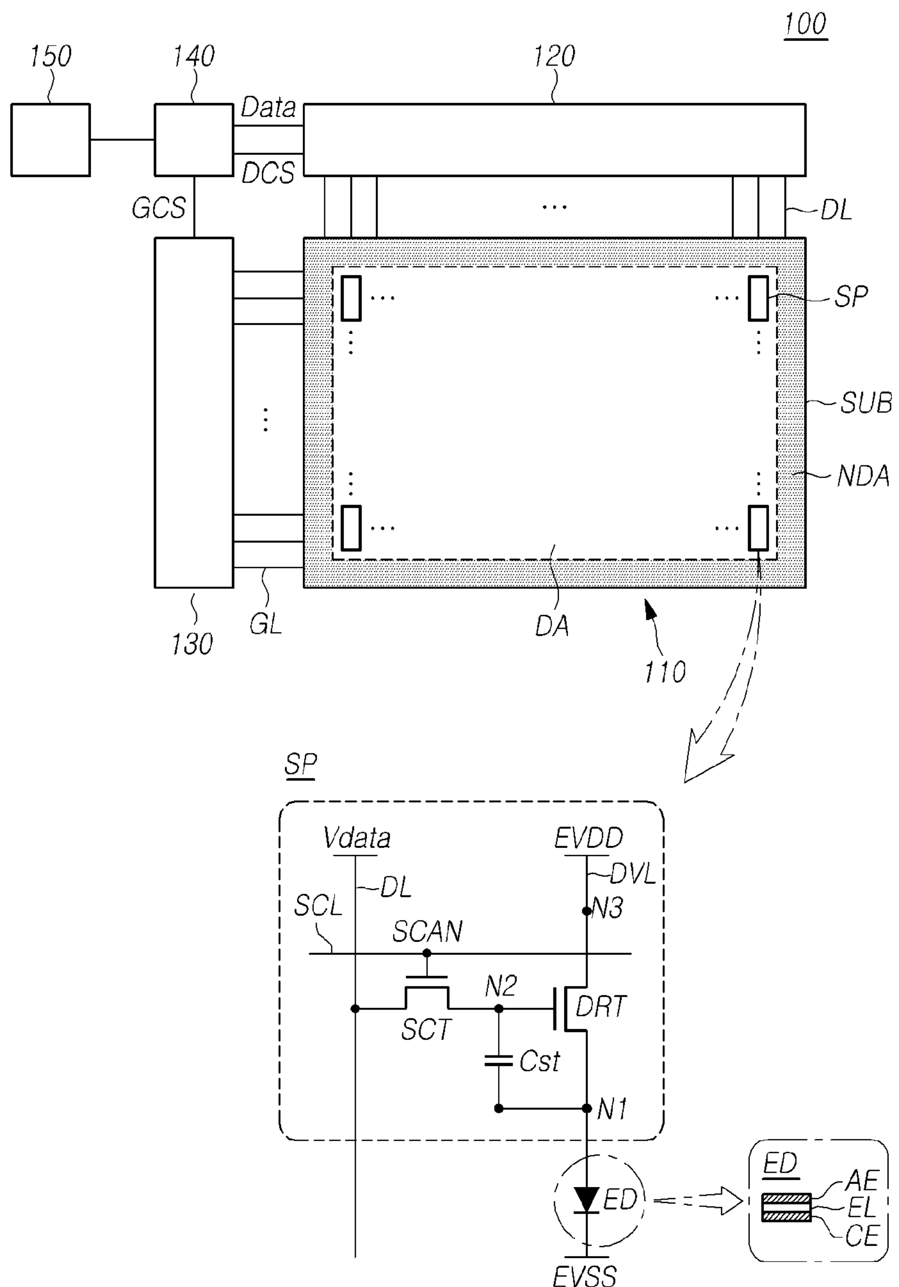
FIG. 1 is a system configuration diagram of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the attached drawings.

FIG. 1 is a system configuration diagram of a display device (100) according to embodiments of the present disclosure. Referring to FIG. 1, a display driving system of the display device (100) according to the embodiments of the present disclosure may include a display panel (110) and a display driving circuit for driving the display panel (110).

The display panel (110) may include a display region (DA) in which a video is displayed and a non-display region (NDA) in which no video is displayed. The display panel (110) may include multiple subpixels (SP) disposed on the substrate (SUB) for video display. The display panel (110) may include multiple signal wirings disposed on the substrate (SUB). For example, the multiple signal wirings may include data lines (DL), gate lines (GL), drive voltage lines, and the like.

The multiple data lines (DL) may be disposed to extend in a first direction (for example, a column direction or a row direction), and the multiple gate lines (GL) may be disposed to extend in a direction intersecting the first direction.

The display driving circuit may further include a data driving circuit (120), a gate driving circuit (130), and a controller (140) for controlling the data driving circuit (120) and the gate driving circuit (130).

The data driving circuit (120) may output data signals (also referred to as data voltages) corresponding to a video signal to the multiple data lines (DL). The gate driving circuit (130) may generate gate signals and output the gate signals to the multiple gate lines (GL). The controller (140) may convert input video data input from an external host (150) into a data signal format used by the data driving circuit (120) and supply converted video data to the data driving circuit (120).

The data driving circuit (120) may include one or more source driver integrated circuits. For example, each source driver integrated circuit may be connected to the display panel (110) using a tape automated bonding (TAB) method, may be connected to a bonding pad of the display panel (110) using a chip one glass (COG) or chip on panel (COP) method, or may be implemented using a chip on film (COF) method and connected to the display panel (110).

The gate driving circuit (130) may be connected to the display panel (110) using a tape automated bonding (TAB) method, may be connected to a bonding pad of the display panel (110) using the COG or COP method, may be connected to the display panel (110) using The COF method, or may be formed in the non-display region (NDA) of the display panel (110) as a gate in panel (GIP) type.

Referring to FIG. 1, in the display device (100) according to embodiments of the present disclosure, each subpixel (SP) may include a light emitting element (ED) and a pixel driving circuit (SPC) for driving the light emitting element, and the pixel driving circuit (SPC) may include a driving transistor (DRT), a scanning transistor (SCT), and a storage capacitor (Cst).

The driving transistor (DRT) may drive the light emitting element (ED) by controlling a current flowing through the light emitting element (ED). The scanning transistor (SCT) may transfer a data voltage (Vdata) to a second node (N2) that is a gate node of the driving transistor (DRT). The storage capacitor (Cst) may be configured to maintain a voltage for a predetermined period.

The light emitting element (ED) may include an anode electrode (AE), a cathode electrode (CE), and a light emitting layer (EL) positioned between the anode electrode (AE) and the cathode electrode (CE). The anode electrode (AE) may be a pixel electrode engaged in formation of the light emitting element (ED) of each subpixel (SP) and may be electrically connected to a first node (N1) of the driving transistor (DRT). The cathode electrode (CE) may be a common electrode engaged in formation of light emitting elements (ED) of all the subpixels (SP) and may be applied with a ground voltage (EVSS).

For example, the light emitting element (ED) may be an organic light emitting diode (OLED), a light emitting diode (LED) based on an inorganic material, a quantum dot light emitting element that is a semiconductor crystal that emits by itself, or the like.

In a case in which a display device (100) according to embodiments of the present disclosure is an OLED display, each subpixel (SP) may include an organic light emitting diode (OLED) that emits light by itself as a light emitting element. In a case in which a display device (100) according to embodiments of the present disclosure is a quantum dot display, each subpixel (SP) may include a light emitting element formed using a quantum dot that is a semiconductor crystal emitting light by itself. In a case in which a display device (100) according to embodiments of the present disclosure is an LED display, each subpixel (SP) may include a micro light emitting diode (LED) that emits light by itself and is formed on the basis of an inorganic material as a light emitting element.

The driving transistor (DRT) is a transistor used for driving a light emitting element (ED) and may include a first node (N1), a second node (N2), a third node (N3), and the like. The first node (N1) is a source or a drain node and may be electrically connected to the anode electrode (AE) of the light emitting element (ED). The second node (N2) is a gate node and may be electrically connected to a source or drain node of the scanning transistor (SCT). The third node (N3)

may be a drain or source node and electrically connected to a drive voltage line (DVL) that supplies a drive voltage (EVDD). Hereinafter, for the convenience of description, an example in which the first node (N1) is a source node, and the third node (N3) is a drain node will be described.

The scanning transistor (SCT) may perform switching of connection between a data line (DL) and the second node (N2) of the driving transistor (DRT). The scanning transistor (SCT) may control connection between the second node (N2) of the driving transistor (DRT) and a corresponding data line (DL) among the multiple data lines (DL) in response to a scanning signal (SCAN) supplied from a scanning line (SCL) that is one type of gate line (GL).

The storage capacitor (Cst) may be configured between the first node (N1) and the second node (N2) of the driving transistor (DRT).

The structure of the subpixel (SP) illustrated in FIG. 1 is merely an example for description and may additionally include one or more transistors or additionally include one or more capacitors. Alternatively, the multiple subpixels may have the same structure, and some of the multiple subpixels may have a different structure. Each of the driving transistor (DRT) and the scanning transistor (SCT) may be either an n-type transistor or a p-type transistor.

The display device (100) according to embodiments of the present disclosure may have either a top emission structure or a bottom emission structure. Hereinafter, an example in which the display device has the top emission structure will be described. For example, in the case of the top emission structure, the anode electrode (AE) may be a reflective metal, and the cathode electrode (CE) may be a transparent conducting film.

Figure 2:
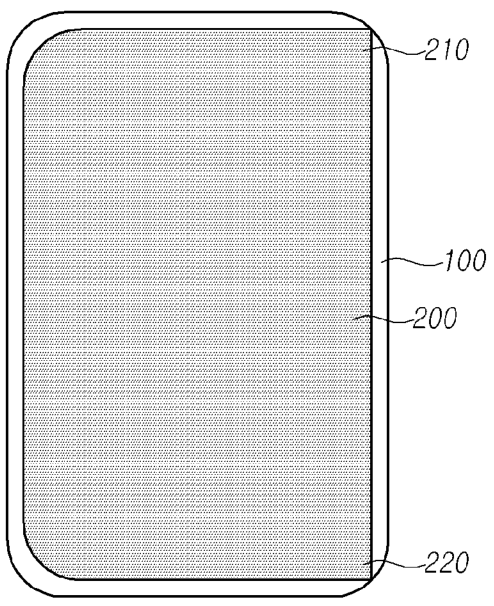
FIG. 2 is a plan view illustrating a display device according to embodiments of the present disclosure.

FIG. 2 is a plan view of a display device according to embodiments of the present disclosure.

Referring to FIG. 2, the display device (100) according to the embodiments of the present disclosure may include a glass substrate (160) and a polarization plate (200).

Although not illustrated in the display device (100) according to embodiments of the present disclosure, a light emitting element layer and an encapsulation layer formed to cover the light emitting element layer may be included between the glass substrate (160) and the polarization plate (200).

The glass substrate (160) may include a display region in which an image is displayed and a non-display region in which no image is displayed.

The display region has a thin film transistor (TFT) and the light emitting element layer disposed therein and is positioned at the center of the glass substrate (160).

The non-display region may be disposed to surround the display region or be disposed to surround only a part of the display region, and various wirings, circuits, driving chip, and the like for driving the thin film transistor (TFT) and the light emitting element layer may be disposed therein.

The glass substrate (160) may be formed using a transparent glass having a plate shape and may be formed using substances such as potassium lime, or quartz as its material. A flexible substrate of a transparent material may be applied to the glass substrate (160).

The glass substrate (160) may be a glass film substrate or a reinforced glass film.

The light emitting element layer may be an organic light emitting element, a micro led, a quantum dot light emitting element, or the like that is driven by a driving element of a pixel circuit.

The organic light emitting element is formed on an upper side of the glass substrate (160) and has a structure in which an anode electrode is used as a positive electrode, a hole injection layer, a light emitting layer, an electron injection layer, and a cathode electrode are sequentially formed.

The organic light emitting element configures a plurality of pixels inside the display region and emits light in accordance with a signal applied through the driving transistor to display an image.

The encapsulation layer is for protecting the light emitting element layer from external factors such as humidity and may be formed to cover the light emitting element layer.

The polarization plate (200) may be disposed on the light emitting element layer.

The polarization plate (200) is positioned on a first surface (also referred to as a front face) of the glass substrate (160). A side of the polarization plate 200 (also referred to as a first side of the polarization plate 200) is spaced apart from a side of the glass substrate 160 (also referred to as a first side of the glass substrate 160), and the side of the polarization plate 200 overlaps the glass substrate 160. Because the side of the polarization plate 200 overlaps the glass substrate 160, the side of the polarization plate 200 is "inside" the side of the glass substrate 160. As such, the side of the glass substrate 160 is also referred to as an "inner side."

The polarization plate (200) may include a first protruded part (210) and a second protruded part (220) disposed at both ends of the side. The first protrude part 210 has a first tip end, and the second protrude part 220 has a second tip end.

The polarization plate (200) may include a start point (S) at which the tip end of the first protruded part (210) coincides (or is aligned) with the first edge of the glass substrate (160) and an end point (F) at which the tip end of the second protruded part (220) coincides with the second edge of the glass substrate (160). That is, the tip end of the first protruded part (210) is aligned with the first edge of the glass substrate (160) and the tip end of the second protruded part (220) is aligned with the second edge of the glass substrate (160). The start point S and the end point F are non-overlapping. The side of the polarization plate is not cut during laser trimming of the polarization plate. Remaining sides of the polarization plate between the first tip and the second tip are cut during the laser trimming. The side of the polarization plate and the remaining sides of the polarization plate between the first tip and the second tip end that are cut during the laser trimming are different from each other.

In some embodiments, the first edge and the second edge of the glass substrate 160 correspond to a plurality of first corners at the first side of the glass substrate. The polarization plate 200 has a plurality of first corners at the first side of the polarization plate 200 that are aligned with the plurality of first corners at the first side of the glass substrate 160. The first side of the polarization plate 200 is between the plurality of first corners of the polarization plate 200 and is spaced apart from the first side of the substrate that is between the plurality of first corners of the polarization plate 200.

In some embodiments, the polarization plate 200 also includes a plurality of second corners at a second side of the polarization plate 200 that is between the plurality of second corners of the polarization plate 200. The substrate includes a plurality of second corners at a second side of the glass substrate 160 that is between the plurality of second corners of the glass substrate 160. The plurality of second corners of the polarization plate 200 are not aligned with the plurality of second corners of the glass substrate 160.

In some embodiments, the plurality of first corners of the polarization plate 200 have a first shape and the plurality of second corners of the polarization plate have a second shape that is different from the first shape.

The polarization plate (200) maintains a predetermined gap from the start point (S) to the end point (F) using laser trimming and may be disposed on the inner side of the glass substrate (160).

The start point (S) and the end point (F) may not coincide with each other. For example, positions of the start point (S) at which laser trimming starts and the end point (F) at which the laser trimming ends may be different from each other.

When the polarization plate (200) is attached on the glass substrate (160) in a process for performing laser trimming, it is attached such that one side of the polarization plate (200) is positioned on the inner side of the glass substrate (160), and, in this case, the first side of the polarization plate (200) positioned on the inner side of the glass substrate (160) is a part that may be cut out through laser trimming.

Thus, a part corresponding to the first side of the polarization plate (200) and a laser trimming part between the start point (S) and the end point (F) may be different from each other.

The edge of the glass substrate (200) may be a corner having a round shape.

By having a structure in which the polarization plate (200) is positioned on the inner side of the glass substrate (160), includes one side of which both tip ends coincide with the edge of the glass substrate (160), and includes a first protruded part (210) and a second protruded part (220) disposed at both tip ends of one side, energy directly transferred by a laser beam to the glass substrate in laser trimming can be minimized or at least reduced, and a robust structure against micro cracks can be formed, whereby the reliability of the glass substrate can be improved.

Although not illustrated in the drawing, a cover window may be further included on the polarization plate (200).

A reinforced glass may be applied to the cover window such that the display panel is protected not only from an external shock but also from a scratch, a pressure, a temperature, a moisture, and the like.

Figure 3:
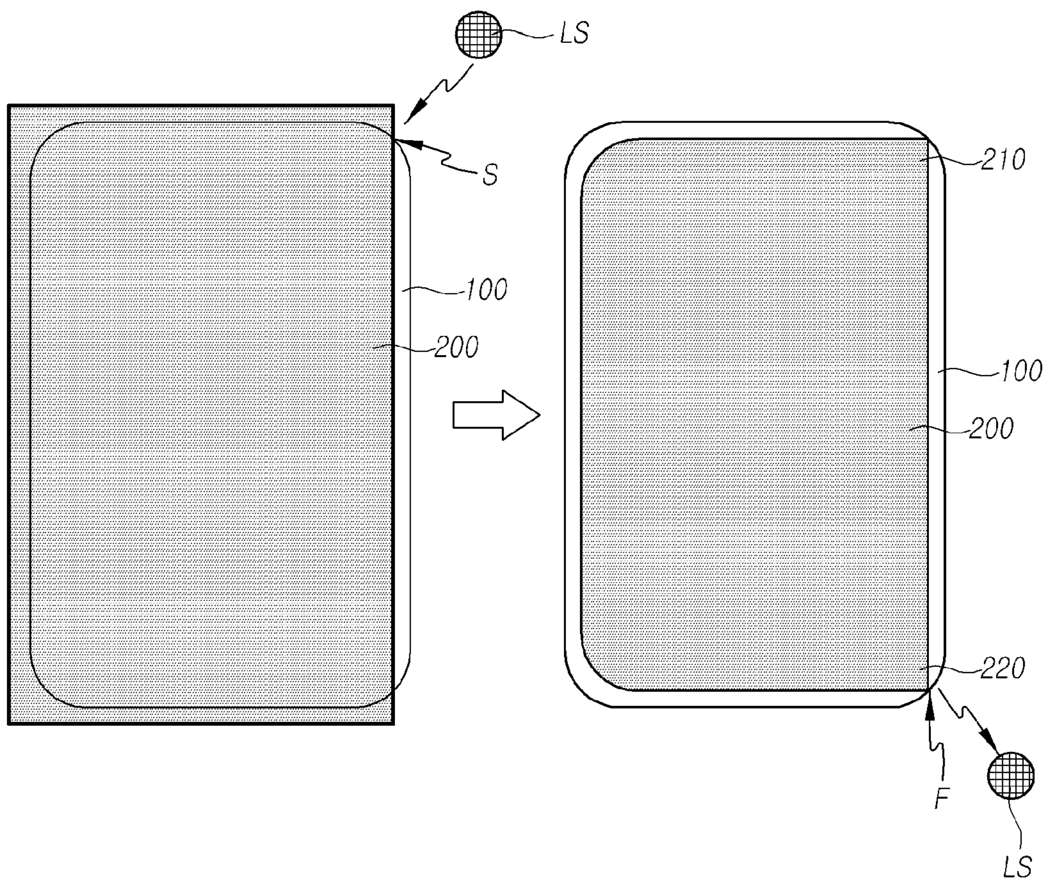
FIG. 3 is a plan view illustrating a process for manufacturing a display device according to embodiments of the present disclosure.

FIG. 3 is a plan view illustrating a process for manufacturing a display device according to embodiments of the present disclosure.

Referring to FIG. 3, the polarization plate (200) may be attached to the glass substrate (160) such that one side thereof is disposed on the inner side of the glass substrate (160). At this time, one side of the polarization plate (200) may include a start point (S) and an end point (F) coinciding with the edge of the glass substrate (160).

A laser unit (LS) may emit a laser beam onto the polarization plate (200) disposed on an upper face of the glass substrate (160).

The laser beam may be emitted from the start point (S) at which one side of the polarization plate (200) coincides with the edge of the glass substrate (160) to the end point (F) that is another point at which one side of the polarization plate (200) coincides with the edge of the glass substrate (160).

After being emitted to the start point (S), the laser beam may move in the direction of advancement of an area in which the glass substrate (160) and the polarization plate (200) are attached and be emitted to the polarization plate (200) such that a predetermined gap is maintained between the edge of the glass substrate (160) and the edge of the polarization plate (200).

After entering the start point (S), the laser beam may be emitted in an advancement direction advancing along the edge of the polarization plate (200) such that a predetermined gap is maintained between the edge of the glass substrate (160) and the edge of the polarization plate (200).

At this time, an additional layer disposed between the glass substrate (160) and the polarization plate (200) may also be trimmed at the same time.

Referring to FIG. 3, the start point (S) and the end point (F) may not coincide with each other. For example, positions of a start point (S) at which laser trimming starts and an end point (F) at which the laser trimming ends may be different from each other. For example, in the process of performing laser trimming, the polarization plate (200) is attached such that one side thereof is positioned on the inner side of the glass substrate (160). In this case, one side of the polarization plate (200) positioned on the inner side of the glass substrate (160) is a part that may not be cut out through laser trimming.

Thus, a part corresponding to one side of the polarization plate (200) and a laser trimming part between the start point (S) and the end point (F) may be different from each other.

In the laser trimming process, the glass substrate (160) and the polarization plate (200) are disposed such that tip ends of overlapping areas coincide with each other, and the start point (S) at which emission of a laser beam starts and an end point (F) at which the emission ends are positioned with a predetermined gap interposed therebetween, whereby a display device in which the polarization plate (200) is disposed on the inner side of the glass substrate (160), and both tip ends of one side of the polarization plate and the edge of the glass substrate (160) coincide with each other can be manufactured.

Embodiments described herein also include a method for manufacturing a display device 100. The method includes positioning a polarization plate 200 on a first surface of a glass substrate 160 such that a first side of the polarization plate 200 is spaced apart from a first side of the glass substrate 160 and the first side of the polarization plate 200 is overlapping the glass substrate, and such that a second side of the polarization plate 200 extends past a second side of the glass substrate 160. The glass substrate 160 has a plurality of first corners at the first side of the glass substrate 160. The method further includes applying a laser from a start point on the first side of the polarization plate that corresponds to a first corner from the plurality of the first corners of the glass substrate to an end point on the first side of the polarization plate that corresponds to another first corner from the plurality of the first corners of the glass substrate without trimming the first side of the polarization plate.

In some embodiments, the laser trimming includes applying the laser from the start point in a direction along remaining sides of the glass substrate 160 until the end point is reached such that a predetermined gap is maintained between the start point and the end point. In some embodiments, applying the laser includes generating corners at the second side of the polarization plate that have a different shape from corners at the first side of the polarization plate 200.

Figure 4:
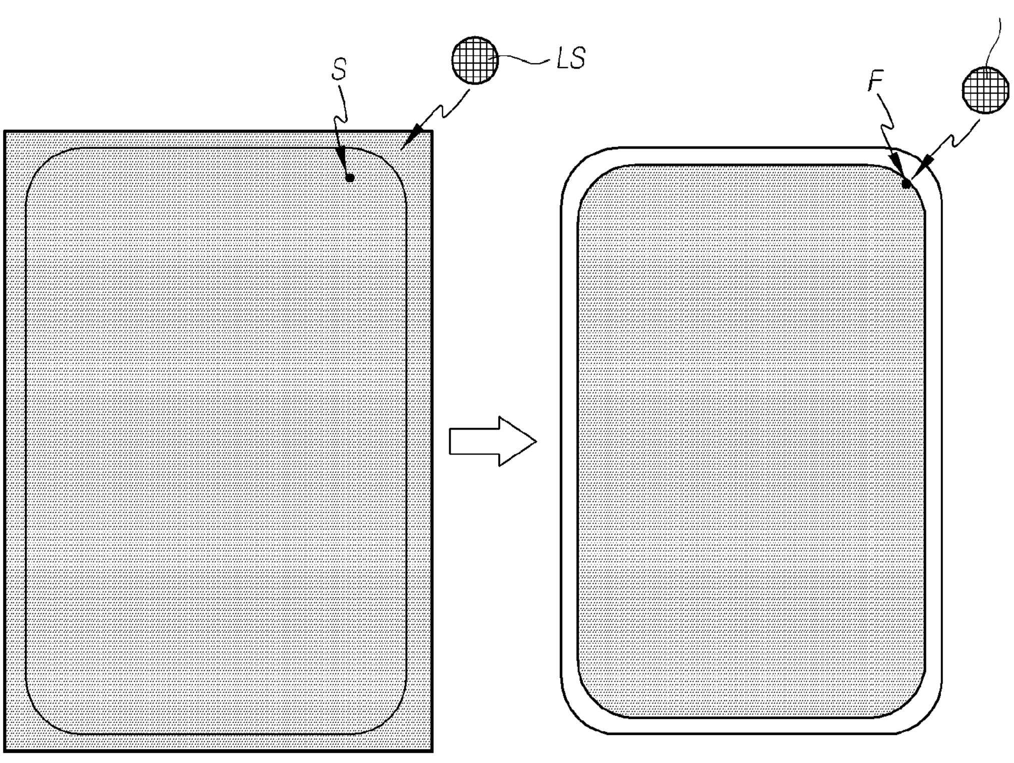
FIG. 4 is a plan view illustrating a process for manufacturing a conventional display device.

FIG. 4 is a plan view illustrating a process for manufacturing a conventional display device.

Conventionally, after a polarization plate (200) is attached to a glass substrate (160), laser trimming is applied to the polarization plate (200) to trim off an allowance part of the polarization plate (200) according to an allowance between the glass substrate (160) and the polarization plate (200), a laser beam is directly emitted to a start point at which trimming starts.

In a case in which a laser beam is directly emitted to the start point (S), energy of the laser beam is accumulated at the start point (S) of the glass substrate (160), and the laser beam directly hits the glass substrate (160) to be damaged. In accordance therewith, micro cracks and the like may be generated, and a problem in the reliability of the glass substrate occurs.

In addition, in accordance with coincidence of a start point (S) at which emission of a laser beam starts and an end point (F) at which the emission ends in laser trimming, the laser beam is emitted to the start point (S) of the glass substrate again when the laser trimming ends, and a problem in the reliability of the glass substrate due to accumulation of energy of the laser beam at the start point (S) of the glass substrate may occur.

However, according to the embodiments of the present disclosure, by having a structure in which a polarization plate is positioned on the inner side of a glass substrate, includes one side of which both tip ends coincide with an edge of the glass substrate, and includes a first protruded part and a second protruded part disposed at both tip ends of the one side, a start point and an end point are different from each other in laser trimming, energy directly transferred by the laser beam to the glass substrate can be minimized or at least reduced, a robust structure against micro cracks can be formed, whereby the reliability of the glass substrate can be improved.

Figure 5A:
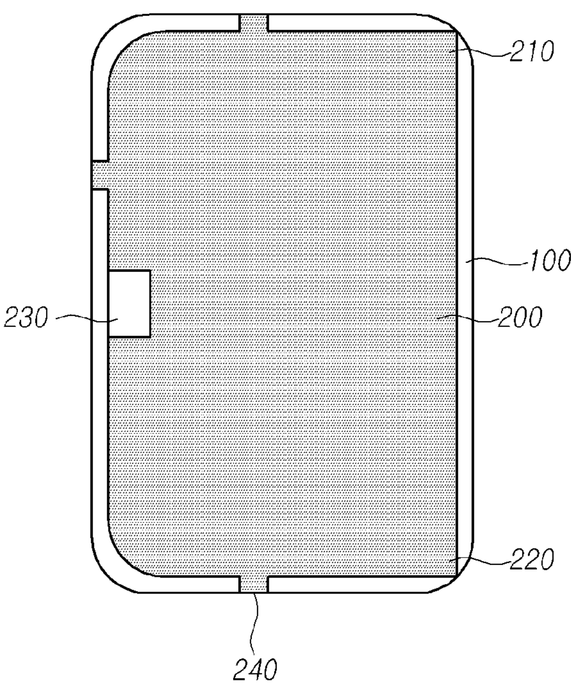
FIGS. 5A and 5B are a plan view and a rear view illustrating a display device according to other embodiments of the present disclosure.
Figure 5B:
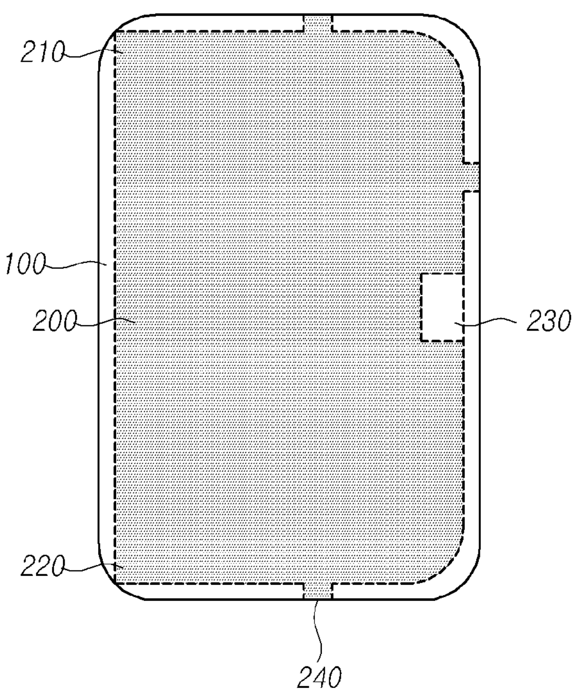

FIGS. 5A and 5B are a plan view and a rear view illustrating a display device according to other embodiments of the present disclosure.

Referring to FIGS. 5A and 5B, a polarization plate (200) may include a notch area or a notch (230). In one embodiment, the notch area (230) is a recess formed from a side (e.g., left side) of the polarization plate 200 towards another side (e.g., right side) of the polarization plate (200) without extending to the other side in a plan view of the display device 100 as shown in FIG. 5A. In some embodiments, applying the laser includes generating a recess at the second side of the polarization plate by applying the laser from the second side of the polarization plate (200) towards the first side of the polarization plate without reaching the first side of the polarization plate (200). The recess is configured to overlap a component module that is configured to be positioned on a second surface of the glass substrate (160).

In an area corresponding to the notch area (230), a component module may be disposed.

For example, a component module may be disposed in the area corresponding to the notch area (230) on a rear face (also referred to as a second surface) of the glass substrate (160). The rear face is opposite the front face of the glass substrate.

The component module may be a camera, a speaker, a sensor, or the like but is not limited thereto.

Referring to FIGS. 5A and 5B, the polarization plate (200) may further include a guide part (240). The guide part (240) may be disposed along an edge of the polarization plate (200), and, in a case in which two or more guide parts (240) are disposed, guide parts (240) adjacent to each other may be disposed to be separate from each other by a predetermined gap. That is, each guide part (240) is configured to separate a corresponding side of the polarization plate (200) from a corresponding side of the glass substrate (160) by a predetermined gap. Guide parts (240) disposed to be separate from each other with a predetermined gap along the edge may be further included.

In some embodiments, applying the laser includes generating a guide part 240 that protrudes from at least one remaining side of the polarization plate such that an outer edge of the guide part is aligned with a corresponding side of the glass substrate while remaining portions of the at least one remaining side are separated from the corresponding side of the glass substrate by a predetermined distance.

By having a structure in which the polarization plate (200) further includes the guide parts (240), the polarization plate (200) can be effectively aligned with the glass substrate (160) or a display panel including the glass substrate (160), and thus the reliability of module processing and the glass substrate can be secured.

According to the embodiments of the present disclosure, by having a structure in which a polarization plate is positioned on the inner side of a glass substrate, includes one side of which both tip ends coincide with an edge of the glass substrate, and includes a first protruded part and a second protruded part disposed at both tip ends of the one side, energy directly transferred by the laser beam to the glass substrate can be minimized or at least reduced in laser trimming, a robust structure against micro cracks can be formed, whereby the reliability of the glass substrate can be improved.

According to the embodiments of the present disclosure, a display device including: a glass substrate including a light emitting element layer: and a polarization plate positioned on an inner side of the glass substrate and including one side of which both tip ends coincide with an edge of the glass substrate, in which the polarization plate includes a first protruded part and a second protruded part disposed at both the tip ends of the one side, can be provided.

A start point at which a tip end of the first protruded part coincides with the edge of the glass substrate and an end point at which a tip end of the second protruded part coincides with the edge of the glass substrate may be included, and the polarization plate may be disposed on the inner side of the glass substrate while maintaining a predetermined gap from the start point to the end point in accordance with laser trimming.

The start point and the end point may be configured not to coincide with each other.

One side of the polarization plate may be a part that has not been cut out in accordance with the laser trimming.

The one side of the polarization plate and a laser trimming part between the start point and the end point may be parts different from each other.

The edge of the glass substrate may be a corner having a round shape.

A component module disposed on a rear face of the glass substrate may be included, and the polarization plate may include a notch area in an area corresponding to the component module.

The polarization plate may include guide parts disposed to be separate with a predetermined gap along the edge.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

What is claimed is:

1. A display device comprising:

a glass substrate including a light emitting element layer, the light emitting element layer configured to emit light; and a polarization plate positioned on a front face of the glass substrate such that a side of the polarization plate is spaced apart from a side of the glass substrate and the side of the polarization plate overlaps the glass substrate, wherein the side of the polarization plate includes a first protruded part having a first tip end that coincides with a first edge of the glass substrate and a second protruded part having a second tip end that coincides with a second edge of the glass substrate.

2. The display device according to claim 1, wherein the first tip end of the first protruded part that coincides with the first edge of the glass substrate corresponds to a start point where laser trimming starts and the second tip end of the second protruded part that coincides with the second edge of the glass substrate corresponds to an end point where the laser trimming ends, and the side of the polarization plate and the side of the glass substrate have a predetermined gap.

3. The display device according to claim 2, wherein the first tip end and the second tip end are non-overlapping.

4. The display device according to claim 2, wherein the side of the polarization plate is not cut during laser trimming of the polarization plate.

5. The display device according to claim 2, wherein the side of the polarization plate and remaining sides of the polarization plate between the first tip end and the second tip end that are cut during the laser trimming are different from each other.

6. The display device according to claim 1, wherein the first edge or the second edge of the glass substrate comprises a corner having a round shape.

7. The display device according to claim 1, further comprising:

a component module on a rear face of the glass substrate that is opposite the front face of the glass substrate, wherein the polarization plate includes a notch area in an area corresponding to the component module.

8. The display device according to claim 1, wherein the polarization plate includes a plurality of guide parts, each guide part configured to separate a corresponding side of the polarization plate from a corresponding side of the glass substrate by a predetermined gap.

9. A display device comprising:

a substrate including a display region in which an image is displayed, the substrate having a plurality of first corners at a first side of the substrate;

a light emitting layer on the display region of the substrate, the light emitting layer configured to emit light; and a polarization plate on the substrate, the polarization plate having a plurality of first corners at a first side of the polarization plate that are aligned with the plurality of first corners at the first side of the substrate, wherein the first side of the polarization plate is between the plurality of first corners of the polarization plate and is spaced apart from the first side of the substrate that is between the plurality of first corners of the polarization plate.

10. The display device of claim 9, wherein the polarization plate includes a plurality of second corners at a second side of the polarization plate that is between the plurality of second corners of the polarization plate, and the substrate includes a plurality of second corners at a second side of the substrate that is between the plurality of second corners of the substrate, wherein the plurality of second corners of the polarization plate are not aligned with the plurality of second corners of the substrate.

11. The display device of claim 10, wherein the plurality of first corners of the polarization plate have a first shape and the plurality of second corners of the polarization plate have a second shape that is different from the first shape.

12. The display device of claim 10, wherein the polarization plate further comprises a recess that extends from the second side of the polarization plate to the first side of the polarization plate without extending to the first side of the polarization plate in a plan view of the display device, and the display device further comprises:

a component module in the recess.

13. The display device of claim 12, wherein the component module comprises one a camera, a speaker, or a sensor.

14. The display device of claim 9, wherein at least one remaining side of the polarization plate includes a guide part protruding from the at least one remaining side, and an outer edge of the guide part is aligned with a side of the substrate such that the guide part separates the at least one remaining side of the polarization plate from the side of the substrate by a predetermined distance.

* * * * *